US012651886B2

(12) United States Patent
Chen et al.

(10) Patent No.: US 12,651,886 B2
(45) Date of Patent: Jun. 9, 2026

(54) LIGHT TRANSMITTER

(71) Applicant: INSTITUTE OF SEMICONDUCTORS, CHINESE ACADEMY OF SCIENCES, Beijing (CN)

(72) Inventors: Shaokang Chen, Beijing (CN); Chunyuan Mu, Beijing (CN); Keqi Cao, Beijing (CN); Jian Wang, Beijing (CN); Yu Liu, Beijing (CN); Wei Chen, Beijing (CN); Ming Li, Beijing (CN); Ninghua Zhu, Beijing (CN)

(73) Assignee: INSTITUTE OF SEMICONDUCTORS, CHINESE ACADEMY OF SCIENCES, Beijing (CN)

( * ) Notice: Subject to any disclaimer, the term of this patent is extended or adjusted under 35 U.S.C. 154(b) by 561 days.

(21) Appl. No.: 18/192,815

(22) Filed: Mar. 30, 2023

(65) Prior Publication Data

US 2023/0387655 A1      Nov. 30, 2023

(30) Foreign Application Priority Data

May 26, 2022    (CN) .......................... 202210590410.0

(51) Int. Cl.
*H01S 5/024* (2006.01)
*H01S 5/02216* (2021.01)
*H01S 5/02251* (2021.01)

(52) U.S. Cl.
CPC ...... *H01S 5/02415* (2013.01); *H01S 5/02251* (2021.01); *H01S 5/02446* (2013.01); *H01S 5/02469* (2013.01); *H01S 5/02216* (2013.01)

(58) Field of Classification Search
CPC ............. H01S 5/02216; H01S 5/02251; H01S 5/02415; H01S 5/02446; H01S 5/02469
See application file for complete search history.

(56) References Cited

U.S. PATENT DOCUMENTS

2002/0027231 A1*   3/2002   Okada ................... H10F 39/804
                                                             257/118
2002/0097468 A1     7/2002   Mecherle et al.
(Continued)

FOREIGN PATENT DOCUMENTS

CN          101017956 A       8/2007
CN          204213669 U       3/2015
(Continued)

OTHER PUBLICATIONS

Patel, "Transparent and Thermally conductive Polycarbonate (PC)/Alumina(Al2O3) Nanocomposites: Preparation and Characterizations," 2013, Polymer-Plastics TEchnology and Engineering, 52, pp. 1557-1565. (Year: 2013).*
(Continued)

*Primary Examiner* — Michael Carter
(74) *Attorney, Agent, or Firm* — Westman, Champlin & Koehler, P.A.

(57) ABSTRACT

Provided is a light transmitter, including: a substrate; a semiconductor refrigeration assembly arranged on the substrate; a light emitting assembly mounted on the semiconductor refrigeration assembly, so that the semiconductor refrigeration assembly cools the light emitting assembly, and the light emitting assembly is configured to generate a laser beam; a tube shell mounted on the substrate to package the semiconductor refrigeration assembly and the light emitting assembly; an optical fiber configured to output the laser beam generated by the light emitting assembly to an outside of the tube shell; and a transparent filling glue filled in a space between an inner wall of the tube shell and the substrate, and configured to guide the laser beam generated by the light emitting assembly to the optical fiber and transfer a heat generated by the light emitting assembly to the tube shell.

6 Claims, 3 Drawing Sheets

(56) References Cited

U.S. PATENT DOCUMENTS

2002/0126717 A1*  9/2002  Nasu ................... H01S 5/02251
                                                           372/32
2017/0153400 A1*  6/2017  Kasai ................... H01S 5/0071
2018/0076595 A1*  3/2018  Honda ............... H01S 5/02446

FOREIGN PATENT DOCUMENTS

CN         204227082     *  3/2015
CN         104678517  A     6/2015
CN         104734782  A     6/2015
CN         214795313  U    11/2021

OTHER PUBLICATIONS

Translation of First Chinese Office Action issued on Feb. 11, 2025
for Chinese patent Application No. 202210590410.0, 15 pages.

* cited by examiner

LIGHT TRANSMITTER

CROSS-REFERENCE TO RELATED APPLICATION

This application claims the priority of Chinese Patent Application No. 202210590410.0 filed on May 26, 2022 in the China National Intellectual Property Administration, the content of which is incorporated herein by reference in entirety.

TECHNICAL FIELD

The present disclosure relates to a field of optoelectronic device packaging, and in particular, to a high performance 14-pin butterfly packaged light transmitter with a wide temperature working range.

BACKGROUND

An optical fiber communication network serves backbone networks such as a base station to upstream switching equipment, a metropolitan area network, a bearer network, and a backbone network, as well as data centers that require massive information exchange.

A semiconductor laser device as a light transmitter is one of the core electronic devices of optical communication. With the increasing demand for information exchange, the bandwidth of a laser device needs to be higher and higher, and this will make the power consumption of a light transmitter become higher and higher. In addition, a light transmitter is applied in some special scenarios, such as high temperature environment, and this also puts forward higher requirements for packaging technology.

Butterfly packaging is a common packaging form for a semiconductor laser device. A traditional butterfly tube shell has 14 pins, the whole shape is like an open butterfly wing, and therefore it is called butterfly packaging. However, for the design solution of a butterfly packaged laser device in the related art, in the case of a long-term operation, a temperature increase of a light-emitting device will affect the light-emitting performance due to a poor heat dissipation performance, and it may not well cope with an extreme temperature environment caused by a high power consumption.

SUMMARY

In order to solve at least some technical problems in the above and other aspects of the prior art, according to an aspect of the present disclosure, there is provided a light transmitter, including:

a substrate;

a semiconductor refrigeration assembly arranged on the substrate;

a light emitting assembly mounted on the semiconductor refrigeration assembly, so that the semiconductor refrigeration assembly cools the light emitting assembly, and the light emitting assembly being configured to generate a laser beam;

a tube shell mounted on the substrate to package the semiconductor refrigeration assembly and the light emitting assembly;

an optical fiber configured to output the laser beam generated by the light emitting assembly to an outside of the tube shell; and a transparent filling glue filled in a space between an inner wall of the tube shell and the substrate, and configured to guide the laser beam generated by the light emitting assembly to the optical fiber and transfer a heat generated by the light emitting assembly to the tube shell.

In some embodiments of the present disclosure, the semiconductor refrigeration assembly includes a first refrigeration portion and a second refrigeration portion configured to perform refrigeration independently of each other, and a first pin, a second pin, a third pin and a fourth pin of the first refrigeration portion and the second refrigeration portion extend out of the tube shell parallel to a mounting surface of the substrate, and the light emitting assembly includes:

a light emitting portion mounted on the first refrigeration portion and configured to generate the laser beam; and a light guide portion mounted on the second refrigeration portion and configured to guide the laser beam to the optical fiber.

In some embodiments of the present disclosure, the light emitting portion includes:

a laser device chip configured to generate the laser beam, the laser beam being split into a first laser and a second laser; and a backlight detector configured to monitor a working state of the laser device chip according to the first laser received, a fifth pin and a sixth pin of the backlight detector extending out of the tube shell parallel to the mounting surface of the substrate.

In some embodiments of the present disclosure, the light guide portion includes:

two lenses mounted on an optical path of the second laser in sequence and configured to adjust an optical field of the second laser, so as to reduce a coupling loss in a transmission process of the second laser; and an optical isolator mounted between the two lenses to reduce an influence of a reflected light on the laser device chip in the transmission process of the second laser.

In some embodiments of the present disclosure, the laser device chip includes a light emitting diode, a positive electrode of the light emitting diode is connected with a seventh pin extending out of the tube shell parallel to the mounting surface of the substrate;

a negative electrode of the light emitting diode is electrically connected with a matching resistor and a first end of an inductor, the matching resistor is configured to match a resistance of the light emitting diode and a resistance of an internal circuit of the tube shell, the inductor is configured to isolate an alternating current signal of a current; and the matching resistor and a second end of the inductor are respectively connected with an eighth pin and a ninth pin extending out of the tube shell parallel to the mounting surface of the substrate.

In some embodiments of the present disclosure, the light emitting portion further includes:

a first thermistor mounted on the first refrigeration portion, the first thermistor being configured to sense a temperature around the laser device chip and the backlight detector, the first refrigeration portion being configured to control a temperature near the laser device chip and the backlight detector according to the temperature detected by the first thermistor;

the light guide portion includes a second thermistor mounted on the second refrigeration portion, the second thermistor being configured to sense a temperature around the optical path of the second laser, the second refrigeration portion being configured to control a temperature near the optical path of the second laser according to the temperature detected by the second thermistor, and a tenth pin, an eleventh pin, a twelfth pin and a thirteenth pin of the first thermistor and the second thermistor extend out of the tube shell parallel to the mounting surface of the substrate.

In some embodiments of the present disclosure, the transparent filling glue has a refractive index of 1.3 to 1.7.

In some embodiments of the present disclosure, the transparent filling glue is a modified filler of nano alumina or nano zinc oxide.

In some embodiments of the present disclosure, the light transmitter further includes: a heat sink mounted between the first refrigeration portion/the second refrigeration portion and the light emitting portion/the light guide portion, so as to provide support and heat dissipation for the light emitting portion and the light guide portion.

In some embodiments of the present disclosure, the light transmitter further includes: a subcarrier mounted between the heat sink and the light emitting portion.

DESCRIPTION OF REFERENCE SIGNS

1: Tube shell;
2: Laser device chip;
3: Backlight detector;
4: Lens;
5: Optical isolator;
61: First thermistor;
62: Second thermistor;
71: First refrigeration portion;
72: Second refrigeration portion;
8: Substrate;
9: Light-emitting portion;
10: Light guide portion;
11: Subcarrier;
12: Heat sink;
13: Optical fiber;
14: Transparent filling glue;
15: First pin;
16: Second pin;
17: Third pin;
18: Fourth pin;
19: Fifth pin;
20: Sixth pin;
21: Seventh pin;
22: Eighth pin;
23: Ninth pin;
24: Tenth pin;
25: Eleventh pin;

26: Twelfth pin;
27: Thirteenth pin;
28: Fourteenth pin.

DETAILED DESCRIPTION OF EMBODIMENTS

In order to make the objectives, technical solutions and advantages of the present disclosure more clear, the present disclosure will be further described in detail below in combination with specific embodiments and with reference to the accompanying drawings.

However, it should be understood that these descriptions are only exemplary, and are not intended to limit the scope of the present disclosure. In the following detailed description, for convenience of explanation, numerous specific details are set forth in order to provide a thorough understanding of the embodiments of the present disclosure. However, it will be apparent that one or more embodiments may also be implemented without these specific details. Additionally, in the following description, descriptions of commonly known technologies are omitted to avoid unnecessarily obscuring the concepts of the present disclosure.

The terms used herein are only for the purpose of describing specific embodiments, and are not intended to limit the present disclosure. The term "comprise/include" used herein indicates a presence of a feature, a step or an operation, but does not exclude a presence or an addition of one or more other features.

All terms (including technical and scientific terms) used herein have the meanings as commonly understood by those of ordinary skill in the art, unless otherwise defined. It should be noted that terms used herein should be construed to have meanings consistent with the context of the present description and should not be construed in an idealized or overly rigid manner.

Figure 1:
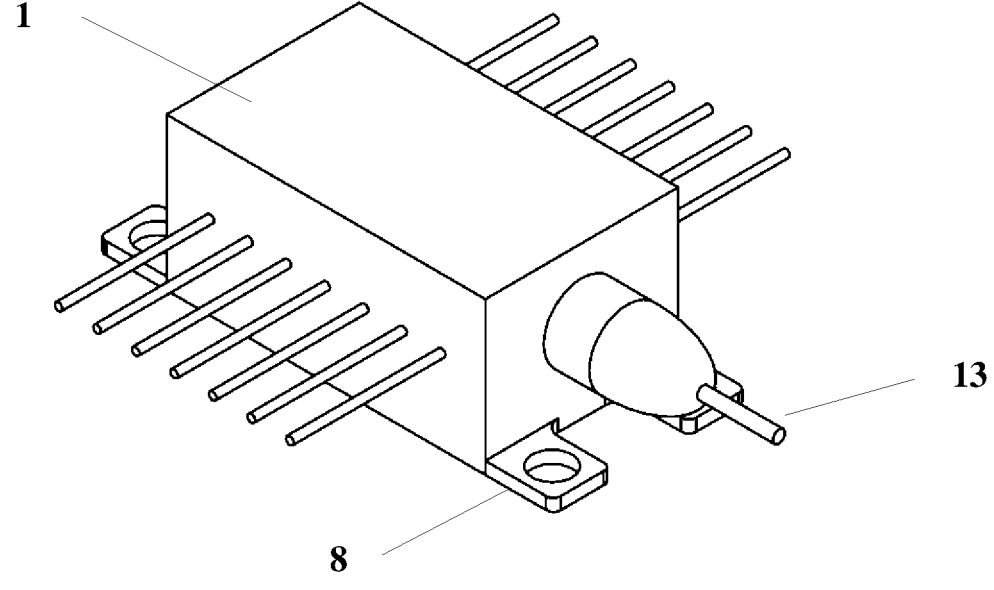
FIG. 1 is a stereogram of a light transmitter according to an exemplary embodiment of the present disclosure.
Figure 3:
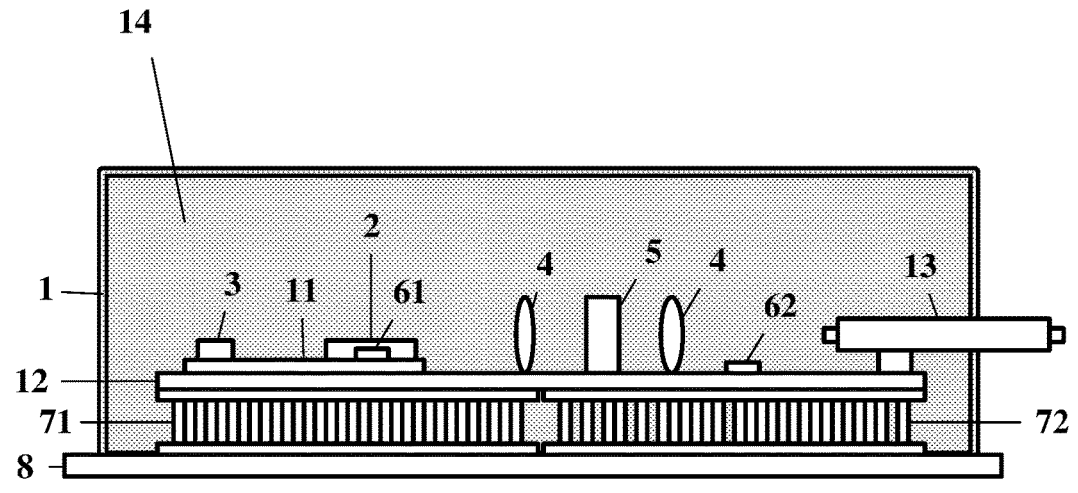
FIG. 3 is a cross-sectional view of the light transmitter shown in FIG. 1.
Figure 4:
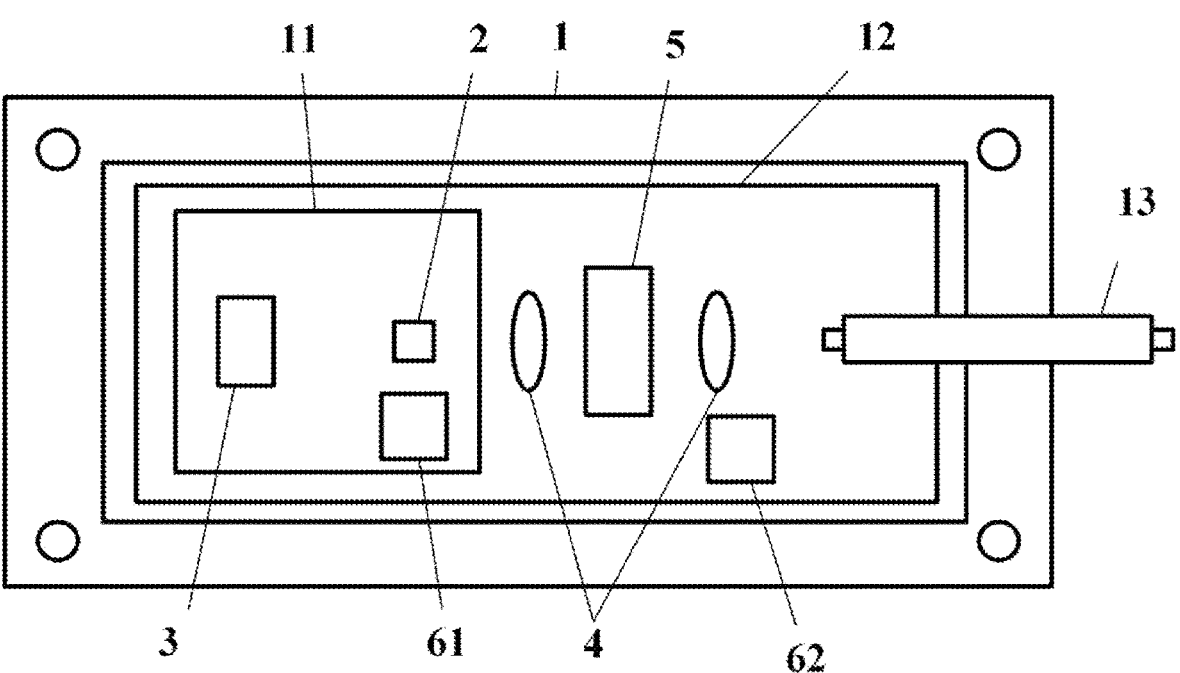
FIG. 4 is a top view of the light transmitter shown in FIG. 1 without a tube shell being mounted and without a filling glue being filled.

FIG. 1 is a stereogram of a light transmitter according to an exemplary embodiment of the present disclosure. FIG. 3 is a cross-sectional view of the light transmitter shown in FIG. 1. FIG. 4 is a top view of the light transmitter shown in FIG. 1 without a tube shell being mounted and without a filling glue being filled.

According to the embodiments of an aspect of the present disclosure, there is provided a light transmitter. As shown in FIG. 1, FIG. 3 and FIG. 4, the light transmitter includes: a substrate 8; a semiconductor refrigeration assembly arranged on the substrate 8; a light emitting assembly mounted on the semiconductor refrigeration assembly, so that the semiconductor refrigeration assembly cools the light emitting assembly, and the light emitting assembly is configured to generate a laser beam; a tube shell 1 mounted on the substrate 8 to package the semiconductor refrigeration assembly and the light emitting assembly; an optical fiber 13 configured to output the laser beam generated by the light emitting assembly to an outside of the tube shell 1; and a transparent filling glue 14 filled in a space between an inner wall of the tube shell 1 and the substrate 8, and configured to guide the laser beam generated by the light emitting assembly to the optical fiber 13 and transfer a heat generated by the light emitting assembly to the tube shell 1. The heat inside the light transmitter may be transferred out more effectively and fast by using the transparent filling glue, so that the light transmitter may work in a wider temperature range. The thermal conductivity of the transparent filling glue is greater than 10 W/(m·K) and the light transmittance thereof is higher than 98%. According to the embodiments of the present disclosure, the working range of the light transmitter may be between −45 degrees to 85 degrees.

Figure 2:
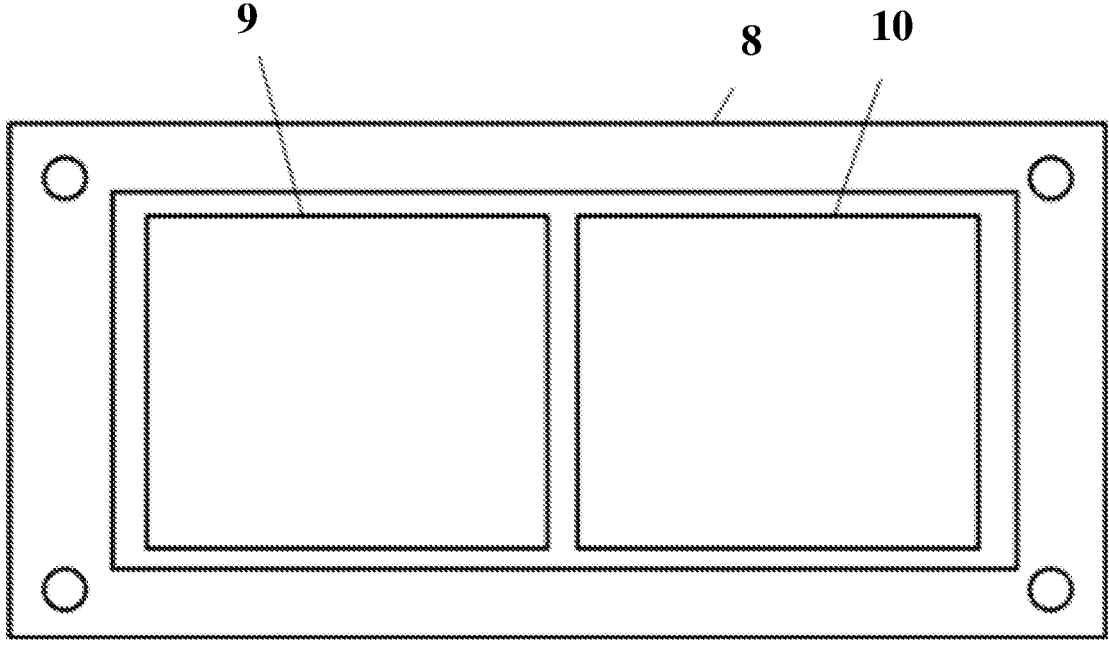
FIG. 2 is a bottom view of the light transmitter shown in FIG. 1.
Figure 5:
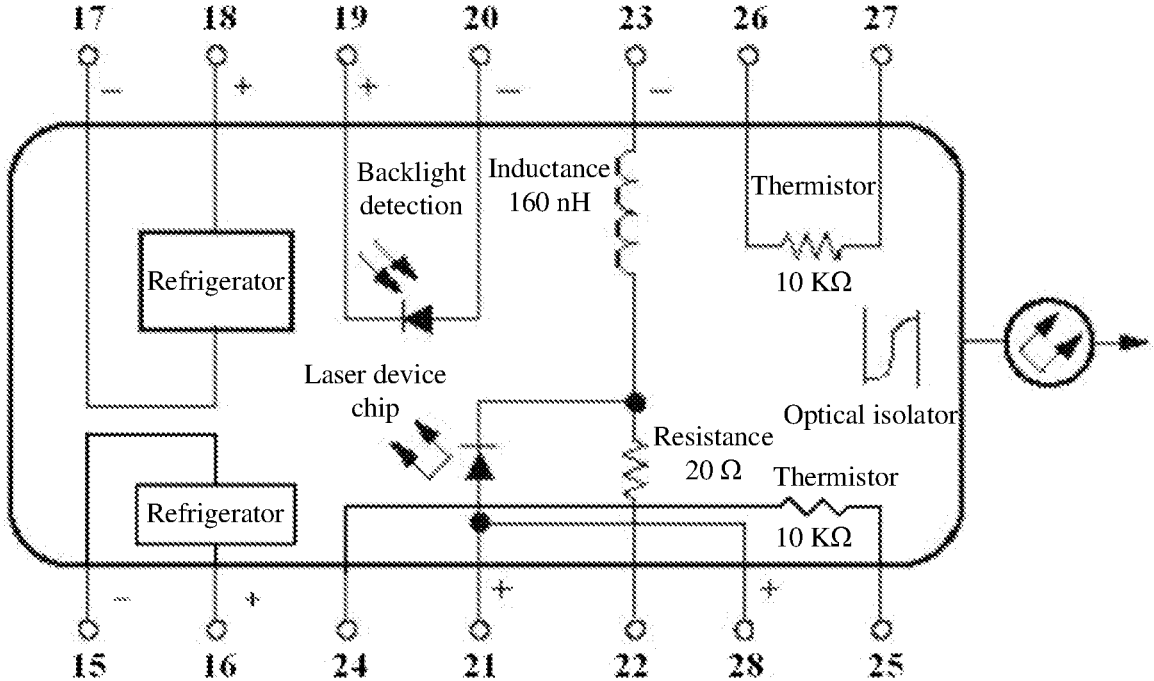
FIG. 5 is a circuit diagram of the light transmitter shown in FIG. 1.

FIG. 2 is a bottom view of the light transmitter shown in FIG. 1. FIG. 5 is a circuit diagram of the light transmitter shown in FIG. 1.

In some embodiments of the present disclosure, as shown in FIG. 2 and FIG. 5, the semiconductor refrigeration assembly includes a first refrigeration portion 71 and a second refrigeration portion 72 configured to perform refrigeration independently of each other. Lower portions of the first refrigeration portion 71 and the second refrigeration portion 72 are exposed to the outside from a lower portion of the substrate to improve the heat dissipation efficiency. A first pin 15, a second pin 16, a third pin 17 and a fourth pin 18 of the first refrigeration portion 71 and the second refrigeration portion 72 extend out of the tube shell 1 parallel to a mounting surface of the substrate 8. The light emitting assembly includes: a light emitting portion 9 mounted on the first refrigeration portion 71 and configured to generate the laser beam; and a light guide portion 10 mounted on the second refrigeration portion 72 and configured to guide the laser beam to the optical fiber 13. The first refrigeration portion 71 and the second refrigeration portion 72 are composed of semiconductor refrigerators. Semiconductor refrigerators use the Peltire effect. That is, when a current passes through a circuit composed of different conductors, phenomena such as heat absorption and heat release will respectively occur at the junctions of different conductors with different current directions, in addition that an irreversible Joule heat is generated. In the embodiments of the present disclosure, the heat absorption surface of the peninsula refrigerator faces the inside of the tube shell and the heat release surface faces the outside of the tube shell.

In some embodiments of the present disclosure, as shown in FIG. 3 and FIG. 4, the light emitting portion 9 includes: a laser device chip 2 configured to generate the laser beam, the laser beam is split into a first laser and a second laser; and a backlight detector 3 configured to monitor a working state of the laser device chip 2 according to the first laser received, a fifth pin 19 and a sixth pin 20 of the backlight detector 3 extend out of the tube shell 1 parallel to the mounting surface of the substrate. The light transmitter in the embodiments of the present disclosure uses a butterfly encapsulation with 14 pins on the packaging, and 14 pins are set on the tube shell with respectively 7 pins on two sides. The light transmitter using such a butterfly packaging has more pins, into which more devices, such as refrigerators, may be put for power-on, and is commonly used in a transmission system of high rate, long distance and high-performance.

In some embodiments of the present disclosure, as shown in FIG. 3 and FIG. 4, the light guide portion 10 includes: two lenses 4 mounted on an optical path of the second laser in sequence and configured to adjust an optical field of the second laser, so as to reduce a coupling loss in a transmission process of the second laser; and an optical isolator 5 mounted between the two lenses 4 to reduce an influence of a reflected light on the laser device chip 2 in the transmission process of the second laser. By setting two lenses, the coupling efficiency of an optical signal may be effectively improved. By setting an optical isolator, light is allowed to pass through in only one direction, and is prevented to pass through in an opposite direction, thus effectively isolating the light reflected by an echo.

In some embodiments of the present disclosure, the laser device chip 2 includes a light emitting diode. A positive electrode of the light emitting diode is connected with a seventh pin 21 and a fourteenth pin 28 extending out of the tube shell 1 parallel to the mounting surface of the substrate 8. A negative electrode of the light emitting diode is electrically connected with a matching resistor and a first end of an inductor. The matching resistor is configured to match resistances of the light emitting diode and an internal circuit of the tube shell 1. The inductor is configured to isolate an alternating current signal of a current. The matching resistor and a second end of the inductor are respectively connected with an eighth pin 22 and a ninth pin 23 extending out of the tube shell 1 parallel to the mounting surface of the substrate 8. Various components and devices inside the light transmitter in the embodiments of the present disclosure are electrically connected by gold wires.

In some embodiments of the present disclosure, the light emitting portion 9 further includes: a first thermistor 61 mounted on the first refrigeration portion 71. The first thermistor is configured to sense a temperature around the laser device chip 2 and the backlight detector 3. The first refrigeration portion 71 is configured to control a temperature near the laser device chip 2 and the backlight detector 3 according to the temperature detected by the first thermistor. The light guide portion 10 includes a second thermistor 62 mounted on the second refrigeration portion 72. The second thermistor is configured to sense a temperature around the optical path of the second laser. The second refrigeration portion 72 is configured to control a temperature near the optical path of the second laser according to the temperature detected by the second thermistor. As shown in FIG. 5, a tenth pin 24, an eleventh pin 25, a twelfth pin 26 and a thirteenth pin 27 of the first thermistor and the second thermistor extend out of the tube shell 1 parallel to the mounting surface of the substrate 8. With the distributed temperature control method, two thermistors and two semiconductor refrigerators are used to respectively monitor and control the temperatures in different regions of the light transmitter. This greatly improves the temperature distribution uniformity, the temperature stability, the heat dissipation capacity, the frequency stability of the laser device etc. in the light transmitter.

In some embodiments of the present disclosure, the transparent filling glue 14 has a refractive index of 1.3 to 1.7. A modified heat-conducting transparent organosilicon gel is used as a filler to overcome the problem that a traditional potting adhesive system may not be applied to a light transmitter due to the opacity to light and poor heat conductivity in a traditional packaging process of an optoelectronic device module.

In some embodiments of the present disclosure, the transparent filling glue 14 is a modified filler of nano alumina or nano zinc oxide. Compared with air, the thermal conductivity of the heat-conducting transparent organosilicon gel based on a modified filler of nano alumina or nano zinc oxide has been significantly improved, and this significantly improves the heat dissipation capacity of an optoelectronic device, enhances the mechanical strength of the device, and avoids an adverse effect of water vapor on the laser device chip.

In some embodiments of the present disclosure, the light transmitter further includes: a heat sink 12 mounted between the first refrigeration portion 71/the second refrigeration portion 72 and the light emitting portion 9/the light guide portion 10, so as to provide support and heat dissipation for the light emitting portion 9 and the light guide portion 10; and a subcarrier 11 mounted between the heat sink 12 and the light emitting portion 9.

So far, the embodiments of the present disclosure have been described in detail with reference to the accompanying drawings. It should be noted that, in the accompanying drawings or the text of the description, the implementation manners not shown or described are all manners known to those of ordinary skill in the art, and are not described in detail. Additionally, the above definitions of various assemblies and components are not limited to various specific structures, shapes or manners mentioned in the embodiments, and may be simply modified or replaced by those of ordinary skill in the art.

It should also be noted that, in the specific embodiments of the present disclosure, unless it is known to the contrary, the numerical parameters in the present description and the appended claims are approximations, and may be modified according to the required characteristics obtained based on the content of the present disclosure. In particular, all numbers used in the description and claims to indicate compositional dimensions, range conditions, etc., should be understood to be modified by the expression "about" in all circumstances. In general, the expressed meaning refers to that a specific number includes a change of ±10% in some embodiments, a change of ±5% in some embodiments, a change of ±1% in some embodiments, and a change of ±0.5% in some embodiments.

Those skilled in the art may understand that various combinations and/or collaborations of features recited in various embodiments and/or claims of the present disclosure may be made, even if such combinations or collaborations are not expressly recited in the present disclosure. In particular, various combinations and/or collaborations of the features recited in various embodiments and/or claims of the present disclosure may be made without departing from the spirit and teachings of the present disclosure. All such combinations and/or collaborations fall within the scope of the present disclosure.

The specific embodiments described above further describe the objectives, technical solutions and beneficial effects of the present disclosure in detail. It should be understood that the above descriptions are only specific embodiments of the present disclosure, and are not intended to limit the present disclosure. Within the spirit and principle of the present disclosure, any modification, equivalent replacement, improvement, etc. made should be included within the protection scope of the present disclosure.

What is claimed is:

1. A light transmitter, comprising:
a substrate;
a semiconductor refrigeration assembly arranged on the substrate;
a light emitting assembly mounted on the semiconductor refrigeration assembly, so that the semiconductor refrigeration assembly cools the light emitting assembly, and the light emitting assembly being configured to generate a laser beam;
a tube shell mounted on the substrate to package the semiconductor refrigeration assembly and the light emitting assembly;
an optical fiber configured to output the laser beam generated by the light emitting assembly to an outside of the tube shell; and
a transparent filling glue filled in a space between an inner wall of the tube shell and the substrate, and configured to guide the laser beam generated by the light emitting assembly to the optical fiber and transfer a heat generated by the light emitting assembly to the tube shell,
wherein the semiconductor refrigeration assembly comprises a first refrigeration portion and a second refrigeration portion configured to perform refrigeration independently of each other, and a first pin, a second pin, a third pin and a fourth pin of the first refrigeration portion and the second refrigeration portion extend out of the tube shell parallel to a mounting surface of the substrate, and
the light emitting assembly comprises:
a light emitting portion mounted on the first refrigeration portion and configured to generate the laser beam; and
a light guide portion mounted on the second refrigeration portion and configured to guide the laser beam to the optical fiber,
wherein the light emitting portion comprises:
a laser device chip configured to generate the laser beam, the laser beam being split into a first laser and a second laser; and
a backlight detector configured to monitor a working state of the laser device chip according to the first laser received, a fifth pin and a sixth pin of the backlight detector extending out of the tube shell parallel to the mounting surface of the substrate,
wherein the light guide portion comprises:
two lenses mounted on an optical path of the second laser in sequence and configured to adjust an optical field of the second laser, so as to reduce a coupling loss in a transmission process of the second laser; and
an optical isolator mounted between the two lenses to reduce an influence of a reflected light on the laser device chip in the transmission process of the second laser,
wherein the laser device chip comprises a light emitting diode, a positive electrode of the light emitting diode is connected with a seventh pin extending out of the tube shell parallel to the mounting surface of the substrate;
a negative electrode of the light emitting diode is electrically connected with a matching resistor and a first end of an inductor, the matching resistor is configured to match a resistance of the light emitting diode and a resistance of an internal circuit of the tube shell, the inductor is configured to isolate an alternating current signal of a current; and
the matching resistor and a second end of the inductor are respectively connected with an eighth pin and a ninth pin extending out of the tube shell parallel to the mounting surface of the substrate.

2. The light transmitter according to claim 1, wherein, the light emitting portion further comprises: a first thermistor mounted on the first refrigeration portion, the first thermistor being configured to sense a temperature around the laser device chip and the backlight detector, the first refrigeration portion being configured to control a temperature near the laser device chip and the backlight detector according to the temperature detected by the first thermistor;
the light guide portion comprises a second thermistor mounted on the second refrigeration portion, the second thermistor being configured to sense a temperature around the optical path of the second laser, the second refrigeration portion being configured to control a temperature near the optical path of the second laser according to the temperature detected by the second thermistor, and
a tenth pin, an eleventh pin, a twelfth pin and a thirteenth pin of the first thermistor and the second thermistor extend out of the tube shell parallel to the mounting surface of the substrate.

3. The light transmitter according to claim 1, wherein the transparent filling glue has a refractive index of 1.3 to 1.7.

4. The light transmitter according to claim 3, wherein the transparent filling glue is a modified filler of nano alumina or nano zinc oxide.

5. The light transmitter according to claim 1, wherein the light transmitter further comprises: a heat sink mounted between the first refrigeration portion/the second refrigeration portion and the light emitting portion/the light guide portion, so as to provide support and heat dissipation for the light emitting portion and the light guide portion.

6. The light transmitter according to claim 5, wherein the light transmitter further comprises: a subcarrier mounted between the heat sink and the light emitting portion.

\* \* \* \* \*